US009263424B2

(12) United States Patent
Tan

(10) Patent No.: US 9,263,424 B2
(45) Date of Patent: Feb. 16, 2016

(54) SEMICONDUCTOR CHIP STACKING ASSEMBLIES

(75) Inventor: Qing Tan, Santa Clara, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 13/977,242

(22) PCT Filed: Dec. 6, 2011

(86) PCT No.: PCT/US2011/063601
§ 371 (c)(1),
(2), (4) Date: Jun. 28, 2013

(87) PCT Pub. No.: WO2013/085497
PCT Pub. Date: Jun. 13, 2013

(65) Prior Publication Data
US 2013/0285261 A1    Oct. 31, 2013

(51) Int. Cl.
*H01L 25/16* (2006.01)
*H01L 23/13* (2006.01)
*H01L 23/498* (2006.01)
(Continued)

(52) U.S. Cl.
CPC ............. *H01L 25/167* (2013.01); *H01L 23/13* (2013.01); *H01L 23/49816* (2013.01); *H01L 25/0657* (2013.01); *H01L 25/18* (2013.01); *H01L 2224/16225* (2013.01); *H01L 2225/06513* (2013.01); *H01L 2225/06517* (2013.01); *H01L 2924/10253* (2013.01); *H01L 2924/1461* (2013.01)

(58) Field of Classification Search
CPC ................ H01L 25/167; H01L 25/043; H01L 2224/08145

USPC .......................................... 257/686, 777, 778
See application file for complete search history.

(56) References Cited

U.S. PATENT DOCUMENTS 6,091,138 A * 7/2000 Yu et al. ........................ 257/686
6,150,724 A * 11/2000 Wenzel et al. ................ 257/777
(Continued)

FOREIGN PATENT DOCUMENTS

WO    2013/085497 A1    6/2013

OTHER PUBLICATIONS

International Search Report and Written Opinion received for International Application No. PCT/US2011/063601, mailed on Sep. 3, 2012, 11 pages.

(Continued)

*Primary Examiner* — Peniel M Gumedzoe
(74) *Attorney, Agent, or Firm* — Schwabe, Williamson & Wyatt, P.C.

(57) ABSTRACT

Embodiments of the invention provide semiconductor chip stacking assemblies that provide direct attachment of a first semiconductor device with a second semiconductor device. An assembly comprises a first semiconductor chip that has a first and a second set of electrical interconnect regions disposed on its surface and a second semiconductor chip. The first set of electrical interconnect regions are electrically connected with the electrical interconnect regions of a second semiconductor chip, and the second set of electrical interconnect regions are electrically interconnected with the substrate. Direct electrical connections are for example, silicon photonics device-to-driver or device-to-signal converters, logic-to-memory, memory-to-memory, and logic-to-logic chip interconnections.

14 Claims, 5 Drawing Sheets

(51) Int. Cl.
*H01L 25/065* (2006.01)
*H01L 25/18* (2006.01)

(56) References Cited

U.S. PATENT DOCUMENTS

| | | | | |
|---|---|---|---|---|
| 6,623,178 | B1 * | 9/2003 | Sakurai et al. | 385/92 |
| 7,224,910 | B2 | 5/2007 | Shirazi | |
| 7,880,310 | B2 | 2/2011 | Mathew | |
| 2003/0234452 | A1 * | 12/2003 | Tao et al. | 257/777 |
| 2004/0036134 | A1 * | 2/2004 | Li | 257/432 |
| 2005/0104211 | A1 | 5/2005 | Baba | |
| 2005/0185882 | A1 * | 8/2005 | Zack et al. | 385/15 |
| 2009/0323748 | A1 * | 12/2009 | Nobuhara | 372/43.01 |
| 2010/0215314 | A1 | 8/2010 | Chen | |

OTHER PUBLICATIONS

Intenational Peiminay Repot on Paentability received for PCT Patent Appliction No. PCT/US2011/063601, mailed on Jun. 19, 2014, 8 pages.

Office Action Received for Taiwan Patent Application No. 101144779, mailed on Feb. 4, 2015, 6 Pages of Office Action and 5 Pages of English Translation.

* cited by examiner

SEMICONDUCTOR CHIP STACKING ASSEMBLIES

FIELD OF THE INVENTION

The embodiments of the invention relate generally to semiconductor devices, packages for semiconductor devices, semiconductor device stacking assemblies, and optical communication and data transfer.

BACKGROUND INFORMATION

Integrated circuit (IC) chip performance, power management, and size improvements place increasing demands on the materials and techniques used for packaging and assembly of the resultant IC chips. In general, an integrated circuit chip is also known as a microchip, a silicon chip, a semiconductor chip, a chip, or a die. IC chips are found in a variety of common devices, such as the microprocessors in computers, cars, televisions, CD players, smart phones, and cellular phones. After manufacture, a semiconductor chip is typically packaged in a manner which takes into account the operating environment provided by the device in which the semiconductor chip will reside. In general, the package for the semiconductor chip protects the chip from damage and supplies electronic connections that connect the semiconductor chip to power supplies and other electronic components (performing, for example, input/output functions). As semiconductor chips trend toward higher bandwidth performance and users desire smaller form factors, the packaging of the semiconductor chips must meet size, thermal management, power delivery, interconnect density, and integration challenges.

DETAILED DESCRIPTION OF THE INVENTION

Embodiments of the invention provide semiconductor chip stacking assemblies that provide direct attachment of a first semiconductor device with a second semiconductor device. Semiconductor chip assemblies according to embodiments of the invention can be flip-chip bonded to a substrate or directly to a motherboard. Embodiments of the invention provide low z-height form factor packages and assemblies while providing desirable 3D system integration. Embodiments of the invention can be used, for example, for silicon photonics device-to-driver or device-to-signal converters, logic-to-memory, memory-to-memory, and logic-to-logic interface stacking assemblies. Packaging assemblies according to embodiments of the invention, are useful, for example, for packaging drivers with lasers and transimpedance amplifiers with photodetectors.

Figure 1A:
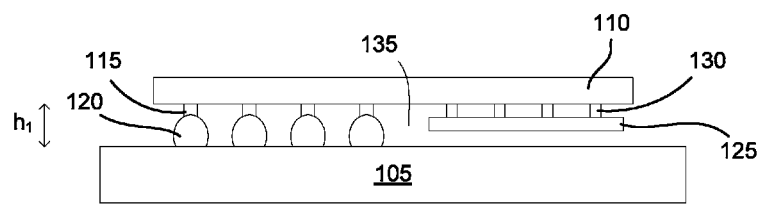
FIGS. 1A-B are schematic diagrams illustrating stacking package assemblies for semiconductor chips.
Figure 1B:
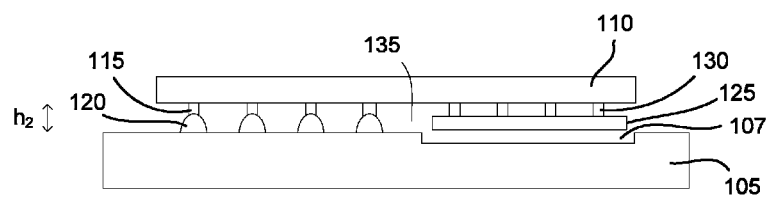

FIGS. 1A-B illustrate packaging assemblies for semiconductor devices. In FIGS. 1A-B, a substrate 105 houses and is electronically coupled to a first semiconductor chip 110. The substrate 105 is, for example, a printed circuit board, a cored or coreless package substrate, a motherboard (mainboard or logicboard), or other substrate comprising electrical interconnections that is capable of electrically interconnecting various elements of a computing system, such as, semiconductor chips, sensors, devices (such as, for example, RF switches, temperature sensors, accelerometers, gyroscopes, oscillators, pizeoresistive sensors, RFID systems, antennas, and/or GPS systems), and/or power supplies. In embodiments of the invention, the substrate 105 is capable of being plugged into or otherwise electrically connected to a motherboard. In embodiments of the invention, semiconductor chip 110 is a silicon photonics device, such as a photosensor or photodetector chip (a substrate comprising one or more photosensors or photodetectors) or a laser chip (a substrate comprising one or more lasers). Photosensors and photodetectors include, for example, chips comprising avalanche photodiodes or PIN diodes, and laser chips include, for example, vertical cavity surface emitting laser (VCSEL) chips, diode laser chips, hybrid semiconductor laser chips. In alternate embodiments of the invention, the semiconductor chip 110 is a logic chip, a processor, a graphics chip, a memory chip, a DSP (digital signal processor) chip or other semiconductor chip as described herein. In FIG. 1B, the substrate comprises a recessed region 107.

In embodiments of the invention, the electrical interconnects 115 associated with the first semiconductor chip 110 can be, for example, conducting pillars, pads, bumps, columns, pins, or other conducting structures. Electrical interconnects (not shown) associated with the substrate 105 can be, for example, conducting pillars, pads, bumps, columns, pins, or other conducting structures. The electrical connection between the first semiconductor chip 110 and the substrate 105 can be formed with or without solder. Semiconductor chip 110 is electronically coupled to substrate 105 through, for example, an optional solder joint 120. Solder joint 120 is bonded to and makes an electrical connection with electrical interconnects 115 on semiconductor chip 110 and corresponding electrical interconnects (not shown) on substrate 105. In an embodiment of the invention, the electrical interconnects of the substrate 105 are pads, the corresponding electrical interconnects 115 of the first semiconductor chip 110 are bumps, columns, or pins, and an electrical connection is formed with a solder joint 120. Electrical interconnections and metal-metal bonding between conducting pillars, pads, bumps, columns, pins, or other conducting structures, that are formed without solder, can be accomplished, for example, through thermocompression bonding, thermosonic bonding, and/or epoxy bonding of the chips. In embodiments of the invention, the pillars, pads, bumps, columns, pins, or other conducting structures can be comprised of gold or copper and thermocompression bonding is used to join them. In embodiments of the invention, electrical interconnects are comprised of a metal. The metal that forms electrical interconnections 115 and those associated with substrate 105 can be, for example, copper, gold, tungsten, platinum, and/or aluminum.

A second semiconductor chip 125 is located between the substrate 105 and the first semiconductor chip 110. The second semiconductor chip 125 is directly bonded to and electrically interconnected with the first semiconductor chip 110 though electrical interconnections 130. Bonding can be through a solder region. Corresponding electrical interconnect regions on the first semiconductor chip 110 and the second semiconductor chip 125 are, for example, conducting pillars, pads, bumps, columns, pins, or other conducting structures. Electrical interconnections and metal-metal bonding between conducting pillars, pads, bumps, columns, pins, or other conducting structures can also be accomplished, for example, through thermocompression bonding, thermosonic bonding, and/or epoxy. The metal that forms electrical interconnections 130 can be, for example, copper, gold, tungsten, platinum, and/or aluminum. In embodiments of the invention, the second semiconductor chip 125 is a driver for a laser or a transimpedance amplifier for a photodetector. In general, a transimpedance amplifier (TIA) converts a current signal from a photodetector into a voltage signal and amplifies it. In further embodiments of the invention, the second semiconductor chip 125 is a logic chip, a memory chip, a processor, a graphics chip, a wireless communication chip, or a wireless communication chipset. In embodiments of the invention, the second semiconductor chip 125 is a thinned semiconductor chip. The semiconductor chip 125 can be thinned to 50 or less in height or between 100 µm and 20 µm in height.

The distance between a first side of the first semiconductor chip 110 and the proximate side of the substrate 105 is represented by 'h$_1$' and 'h$_2$' in FIG. 1A and FIG. 1B, respectively. The height of the gap 135 between the first semiconductor chip 110 and the substrate 105, h$_1$, can be, for example a value between 75 and 150 µm in embodiments of the invention. Solder joints 120 can be sized to create a gap 135 having a desired height. For example, the solder joints can be 25 to 145 µm or 80 to 145 µm in height in embodiments of the invention. The recessed region 107 in substrate 105 is proximate to the second semiconductor chip 125 and allows the height, h$_2$, to be less than the height h$_1$. The height of the gap 135 between the first semiconductor chip 110 and the substrate 105, h$_2$, can be, for example a value between 15 and 125 µm in embodiments of the invention.

The first semiconductor chip 110 can be flip-chip bonded to the substrate 105. Optionally, an underfill material is placed in the gap 135. The underfill material can comprise, for example, a flowable dielectric material, such as, for example, an epoxy with or without filler particles, or a polymer or inorganic material with or without filler particles.

Figure 2A:
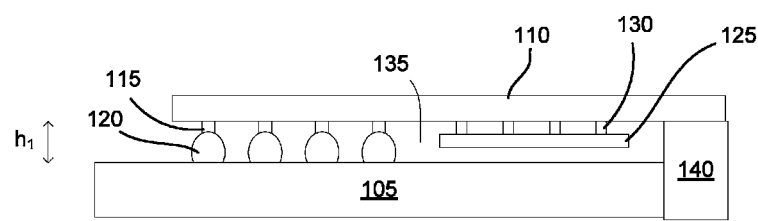
FIGS. 2A-B are schematic diagrams illustrating additional stacking package assemblies for semiconductor chips.
Figure 2B:
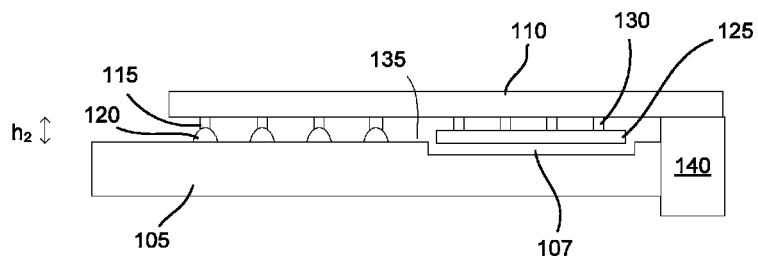

FIGS. 2A-13 provide additional packaging assemblies for semiconductor devices. The elements of the assemblies of FIGS. 2A-B are the same as those discussed with respect to FIGS. 1A-1B. In FIG. 2A-B, however, the first semiconductor chip 110 extends partially beyond the substrate 105 and a part of an optional alignment unit 140 contacts the region of the first semiconductor chip 110 that extends beyond the substrate 105. An alignment unit is useful to align a silicon photonics chip with the optical coupler of a light transfer system that transfers light between elements of a computing system.

Figure 3A:
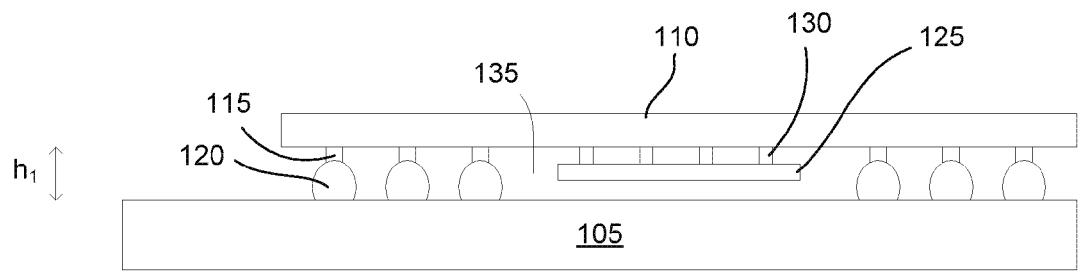
FIGS. 3A-B are schematic diagrams illustrating further stacking package assemblies for semiconductor chips.
Figure 3B:
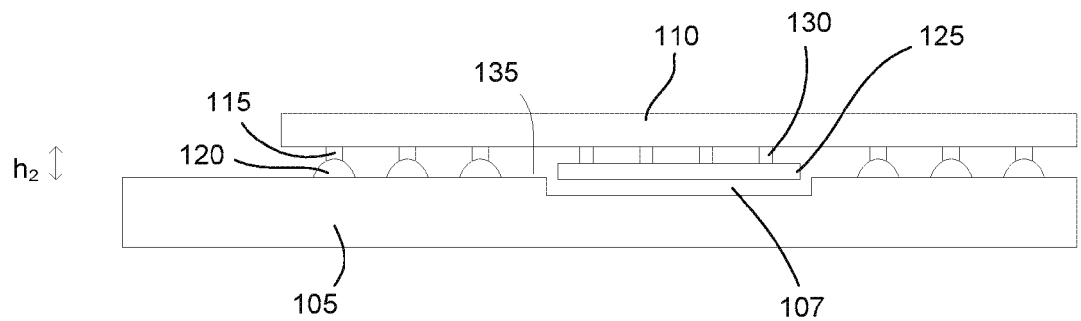

FIGS. 3A-B provide further additional packaging assemblies for semiconductor devices. The elements of the assemblies of FIGS. 3A-B are the same as those discussed with respect to FIGS. 1A-B. In FIGS. 3A-B, however, relative placements of the electrical interconnects 115 and 130 and the first and second semiconductor chips 110 and 125 are altered. Embodiments of the invention are not limited to a particular interconnect pattern or placement of the semiconductor chips relative to one another.

Figure 4:
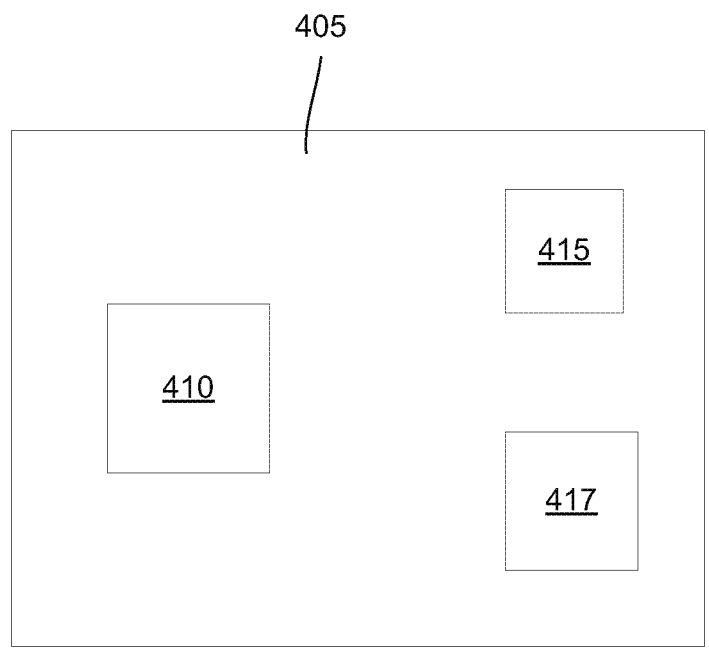
FIG. 4 illustrates an assembly comprising stacked semiconductor chip assemblies and additional semiconductor chips.

FIG. 4 provides an embodiment in which packaging assemblies of the present invention are mounted with a logic chip on a substrate. In FIG. 4, a substrate 405 houses an IC chip 410 and package assemblies 415 and 417. The substrate 405 is, for example, a printed circuit board, a cored or coreless package substrate, a motherboard (mainboard or logicboard), or other substrate comprising electrical interconnections that is capable of electrically interconnecting various elements of a computing system. The IC chip 410 is, for example, a processor, a memory controller hub, a graphics chip, a network chip, or a package comprising one or more chips, such as logic chips and memory chips. Package assemblies 415 and 417 are assemblies according to FIGS. 1A-B, FIGS. 2A-B, and/or FIGS. 3A-B. Package assemblies 415 and 417 are electrically interconnected with IC chip 410 through substrate 405. In embodiments of the invention, package assembly 415 comprises a laser chip and a laser driver and package assembly 417 comprises a photodetector and transimpedance amplifier. The photodetector/transimpedance amplifier allows input optical data to be input into IC chip 410 as an electrical signal. The laser chip/laser driver allows electronic data output from the IC chip 410 to the output as an optical signal. Other numbers of semiconductor chips 410 and assemblies 415 and 417 associated with the substrate 405 are also possible. Other elements that can be associated with the assembly of FIG. 4 include, for example, thermal management systems and optical interconnect systems. There are, of course, many other ways to employ the package assemblies of the present invention.

Figure 5:
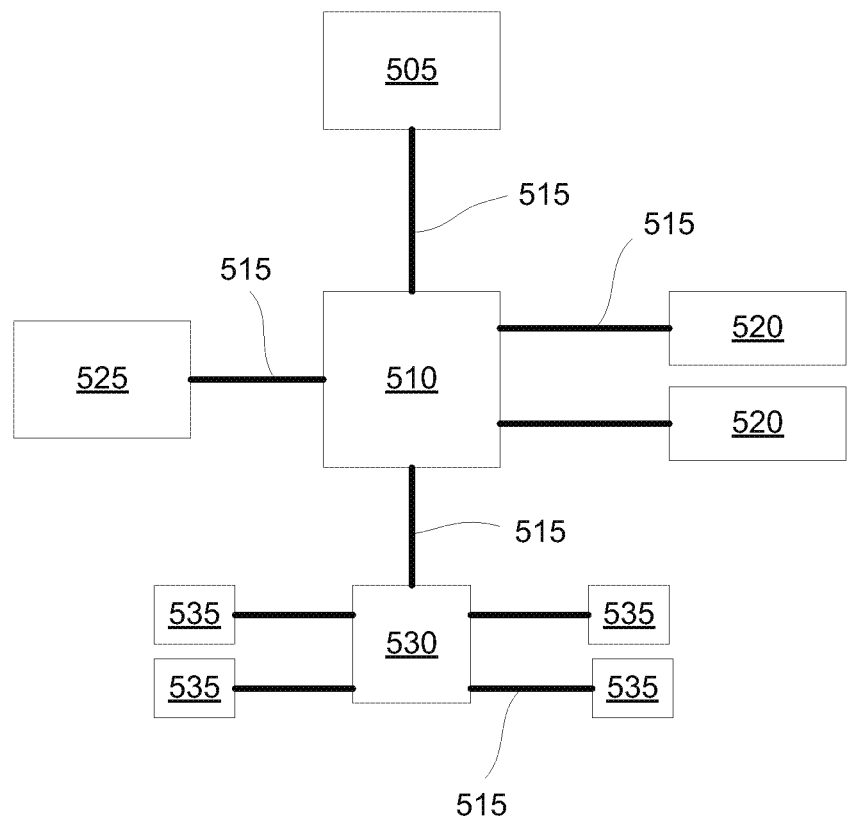
FIG. 5 diagrams a computing system in which stacked assemblies for semiconductor chips can be employed.

FIG. 5 provides an exemplary computing system employing optical data transfer systems. In FIG. 5, a computing system comprises a processor 505 connected to a memory controller hub 510 through an optical interconnection 515. The optical interconnection 515 (the details of which are not shown for clarity of illustration) comprises a laser chip, an optical coupler optically coupled to the laser chip, a photodetector, an optical coupler optically coupled to the photodetector, and one or more waveguides optically coupled to and capable of guiding light between the optical couplers. The laser chip, the photodetector chip, or both are assembled with a driver chip or transimpedance amplifier in a packaging assembly according to FIGS. 1A-B, FIGS. 2A-B, and/or FIGS. 3A-B. The laser chip is capable of receiving data from the output logic chip and the photodetector is capable of sending data to the input logic chip. A two-way I/O communication system comprises at least one laser chip and at least one photodetector associated with a first IC chip, such as a processor, and at least one laser chip and at least one photodetector associated with a second IC chip. The laser associated with the first IC chip is optically coupled to the photodetector associated with the second IC chip, and the laser chip associated with the second IC chip is optically coupled to the photodetector associated with the first IC chip. In embodiments of the invention, the optical interconnect 515 is a two-way link and/or a plurality of optical connections associated, for example, with an array of VCSEL chips and an array of corresponding photodetectors. In the computing system of FIG. 5, the memory controller hub 510 is coupled to memory chips 520 through an optical interconnection 515, to a graphics chip 525 through an optical interconnect 515, and to an input/output controller chip 530 through an optical interconnect 515. The input/output controller chip 530 is connected to input/output devices 535 through optical interconnect 515. Input/output devices 535 include, for example, USB (universal serial bus), USB2, SATA (serial advanced technology attachment), audio, PCI (peripheral component interconnect), and PCI express devices. In embodiments of the invention, one or more elements of the computing system (e.g., 505, 510, 520, 525, 530, and/or 535) are coupled through electrical interconnects rather than optical interconnects 515 and data input/output functions can occur through electrical interconnections. Other configurations and elements are, of course, possible for a computing system.

The semiconductor chips discussed herein can be any type of integrated circuit device, such as, logic chips, processors (single core or multi-core), memory chips, analog chips, digital chips, graphics chips, and/or MEMS devices. For example, the first semiconductor chip can be a processor, a stacked memory/logic unit, or a plurality of stacked memory chips, and the second semiconductor chip can be a memory chip or a logic chip. Other exemplary chips that can form combinations include microprocessors, graphics processors, signal processors, network processors, system-on-chip (SoC) having multiple functional units (such as, one or more processing units, graphics units, communications units, signal processing units, security units), wireless communication chips, and/or wireless communications chipsets. The term "processor" can refer to any device or portion of a device that processes electronic data from registers and or memory to transform that electronic data into other electronic data that may be stored in registers and/or memory. A memory chip can be, for example, static random access memory (SRAM) chip, and/or a dynamic random access memory (DRAM) chip, and/or a non-volatile memory chip. Wireless communication chips enable wireless communications for the transfer of data to and from a computing device. The term does not imply that the associated devices do not contain any wires, although in some embodiments they might not. A wireless communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. A first wireless communication chip may be dedicated to shorter range wireless communications such as Wi-Fi and Bluetooth and a second wireless communication chip may be dedicated to longer range wireless communications such as GPS, EDGE, GPRS, CDMA, WiMAX, LTE, Ev-DO, and others, and the first and the second communication chips may form a communications chipset. In alternate embodiments of the invention, the first semiconductor chip is a silicon photonics device, such as a photodetector chip or a laser chip and the second semiconductor chip is a driver chip or a transimpedance amplifier chip.

Package structures according to embodiments of the invention can comprise part of any type of computing system, such as, for example, a hand-held computing system (e.g., a cell phone, smart phone, or music player), a mobile computing system (e.g., a laptop, netbook, or tablet), a desktop computing system, a server, or a supercomputer. A package structure can be mounted onto a mainboard assembly for integration into a computing system. In general, a mainboard may comprise any suitable type of circuit board or other substrate capable of providing electrical communication between one or more of the various components of the computing system disposed on the board and between the various components disposed on the board and other connected remote elements of the computing system.

Persons skilled in the relevant art appreciate that modifications and variations are possible throughout the disclosure as are substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, or characteristics disclosed in the embodiments may be combined in any suitable manner in one or more embodiments. Various additional layers and/or structures may be included and/or described features may be omitted in other embodiments.

I claim:

1. A device comprising:
a first semiconductor chip having a first surface wherein the first surface has a first and a second set of electrical interconnect regions disposed on the first surface and wherein the first semiconductor chip is a laser chip;
a second semiconductor chip having a second surface facing the first surface, wherein the second surface has electrical interconnect regions disposed thereon and wherein the first set of electrical interconnect regions of the first surface of the first semiconductor chip is electrically connected with the electrical interconnect regions of the second surface of the second semiconductor chip and wherein the second semiconductor chip is a laser driver chip; and
a substrate having electrical interconnect regions wherein the interconnect regions of the substrate are electrically connected to the second set of electrical interconnect regions of the first surface of the first semiconductor chip and wherein the second semiconductor chip is between the first semiconductor chip and the substrate.

2. The device of claim 1 wherein the second semiconductor chip is a thinned semiconductor chip.

3. The device of claim 1 wherein the second semiconductor chip is a semiconductor chip that has a height of between 100 µm and 20 µm.

4. The device of claim 1 wherein the substrate is a printed circuit board, a package substrate, or a mainboard.

5. The device of claim 1 wherein the electrical interconnect regions of the first surface of the first semiconductor chip are connected to the electrical interconnect regions of the substrate with solder.

6. The device of claim 1 wherein the electrical interconnect regions of the first surface of the first semiconductor chip are connected to the electrical interconnect regions of the second surface of the second semiconductor chip with solder.

7. The device of claim 1 wherein the substrate comprises a recessed region proximate to the second semiconductor chip wherein the recessed region faces a third surface of the second semiconductor chip that is opposite the second surface of the second semiconductor chip.

8. A device comprising:
a first semiconductor chip having a first surface wherein the first surface has a first and a second set of electrical interconnect regions disposed on the first surface and wherein the first semiconductor chip is a photodetector chip;
a second semiconductor chip having a second surface facing the first surface, wherein the second surface has electrical interconnect regions disposed thereon and wherein the first set of electrical interconnect regions of the first surface of the first semiconductor chip is electrically connected with the electrical interconnect regions of the second surface of the second semiconductor chip and wherein the second semiconductor chip is a transimpedance amplifier; and
a substrate having electrical interconnect regions wherein the interconnect regions of the substrate are electrically connected to the second set of electrical interconnect regions of the first surface of the first semiconductor chip and wherein the second semiconductor chip is between the first semiconductor chip and the substrate.

9. The device of claim 8 wherein the second semiconductor chip is a thinned semiconductor chip.

10. The device of claim 8 wherein the second semiconductor chip is a semiconductor chip that has a height of between 100 µm and 20 µm.

11. The device of claim 8 wherein the substrate is a printed circuit board, a package substrate, or a mainboard.

12. The device of claim 8 wherein the electrical interconnect regions of the first surface of the first semiconductor chip are connected to the electrical interconnect regions of the substrate with solder.

13. The device of claim 8 wherein the electrical interconnect regions of the first surface of the first semiconductor chip are connected to the electrical interconnect regions of the second surface of the second semiconductor chip with solder.

14. The device of claim 8 wherein the substrate comprises a recessed region proximate to the second semiconductor chip, wherein the recessed region faces a third surface of the second semiconductor chip that is opposite the second surface of the second semiconductor chip.

* * * * *

UNITED STATES PATENT AND TRADEMARK OFFICE
CERTIFICATE OF CORRECTION

PATENT NO. : 9,263,424 B2
APPLICATION NO. : 13/977242
DATED : February 16, 2016
INVENTOR(S) : Qing Tan It is certified that error appears in the above-identified patent and that said Letters Patent is hereby corrected as shown below:

In the specification

Column 1 – AFTER LINE 14 and BEFORE LINE 15 please insert:

--GOVERNMENT INTEREST STATEMENT

This invention was made with Government support under contract number H98230-08-3-0011 awarded by the Department of Defense. The Government has certain rights in this invention.--

Signed and Sealed this
Ninth Day of August, 2016

Michelle K. Lee
*Director of the United States Patent and Trademark Office*